United States Patent
Takimoto et al.

(10) Patent No.: US 10,032,817 B2
(45) Date of Patent: Jul. 24, 2018

(54) PHOTOELECTRIC CONVERSION DEVICE

(71) Applicant: SHARP KABUSHIKI KAISHA, Osaka-shi, Osaka (JP)

(72) Inventors: Takahiro Takimoto, Osaka (JP); Kazuhiro Natsuaki, Osaka (JP); Masayo Uchida, Osaka (JP); Nobuyoshi Awaya, Osaka (JP); Kazuya Ishihara, Osaka (JP); Takashi Nakano, Osaka (JP); Mitsuru Nakura, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 215 days.

(21) Appl. No.: 15/026,724

(22) PCT Filed: Sep. 16, 2014

(86) PCT No.: PCT/JP2014/074436
§ 371 (c)(1),
(2) Date: Apr. 1, 2016

(87) PCT Pub. No.: WO2015/049981
PCT Pub. Date: Apr. 9, 2015

(65) Prior Publication Data
US 2016/0254303 A1    Sep. 1, 2016

(30) Foreign Application Priority Data
Oct. 3, 2013 (JP) ................................. 2013-208219

(51) Int. Cl.
H01L 27/146 (2006.01)
G02B 5/20 (2006.01)
(Continued)

(52) U.S. Cl.
CPC ...... H01L 27/14621 (2013.01); G01J 3/0259 (2013.01); G01J 3/513 (2013.01);
(Continued)

(58) Field of Classification Search
CPC ......... H01L 27/14621; H01L 27/14623; H01L 27/14625
See application file for complete search history.

(56) References Cited

U.S. PATENT DOCUMENTS 5,973,316 A  10/1999  Ebbesen et al.
6,052,238 A   4/2000  Ebbesen et al.
(Continued)

FOREIGN PATENT DOCUMENTS

JP    11-72607 A    3/1999
JP    3008931 B2    2/2000
(Continued)

OTHER PUBLICATIONS

U.S. Office Action for co-pending U.S. Appl. No. 14/776,221 dated Mar. 29, 2017.
(Continued)

*Primary Examiner* — Marc Armand
(74) *Attorney, Agent, or Firm* — Birch, Stewart, Kolasch & Birch, LLP

(57) ABSTRACT

A photoelectric conversion device includes: a first optical filter that has a first pattern periodically having a plurality of structures and is formed of a conductive material film disposed on a first photoelectric conversion element with an insulating film therebetween; and a first optical filter that has a second pattern periodically having a plurality of structures and is formed of a conductive material film disposed on a second photoelectric conversion element with the insulating film therebetween. The interval between the first pattern and the second pattern that are adjacent to each other is longer (Continued)

than a period of the structures in the first pattern and a period of the structures in the second pattern.

8 Claims, 12 Drawing Sheets

(51) Int. Cl.
*G01J 3/51* (2006.01)
*H01L 31/0232* (2014.01)
*G01J 3/02* (2006.01)

(52) U.S. Cl.
CPC ............... *G02B 5/20* (2013.01); *G02B 5/204* (2013.01); *H01L 31/02327* (2013.01)

(56) References Cited

U.S. PATENT DOCUMENTS

| | | | |
|---|---|---|---|
| 7,223,960 | B2 | 5/2007 | Mouli |
| 8,009,356 | B1 | 8/2011 | Shaner et al. |
| 8,148,762 | B2 | 4/2012 | Joe et al. |
| 8,866,950 | B2 | 10/2014 | Yokogawa |
| 2005/0103983 | A1* | 5/2005 | Yamaguchi ....... H01L 27/14621 250/214.1 |
| 2008/0170143 | A1 | 7/2008 | Yoshida |
| 2008/0185692 | A1 | 8/2008 | Salzman |
| 2009/0008730 | A1 | 1/2009 | Roy et al. |
| 2009/0008735 | A1 | 1/2009 | Ogino et al. |
| 2010/0201834 | A1 | 8/2010 | Maruyama et al. |
| 2010/0282945 | A1 | 11/2010 | Yokogawa |
| 2010/0283086 | A1* | 11/2010 | Lee ..................... B82Y 20/00 257/222 |
| 2010/0295143 | A1 | 11/2010 | Yokogawa |
| 2011/0102715 | A1 | 5/2011 | Park et al. |
| 2011/0128405 | A1 | 6/2011 | Handa |
| 2012/0057055 | A1 | 3/2012 | Yokogawa |
| 2013/0037902 | A1 | 2/2013 | Nakazawa et al. |
| 2013/0249040 | A1 | 9/2013 | Liu et al. |
| 2014/0027617 | A1* | 1/2014 | Amikawa ......... H01L 27/14621 250/208.1 |
| 2014/0146207 | A1 | 5/2014 | Yokogawa |

FOREIGN PATENT DOCUMENTS

| | | | |
|---|---|---|---|
| JP | 2007-187835 | A | 7/2007 |
| JP | 2008-177191 | A | 7/2008 |
| JP | 2009-38352 | A | 2/2009 |
| JP | 2010-170085 | A | 8/2010 |
| JP | 2010-186818 | A | 8/2010 |
| JP | 2010-263158 | A | 11/2010 |
| JP | 2010-271049 | A | 12/2010 |
| JP | 2011-176325 | A | 9/2011 |
| JP | 2012-059865 | A | 3/2012 |
| JP | 2013-030626 | A | 2/2013 |
| JP | 2013-38266 | A | 2/2013 |

OTHER PUBLICATIONS

Boltasseva et al., "Low-Loss Plasmonic Metamaterials", Science, vol. 331, pp. 290-291, Jan. 21, 2011.

Ikeda et al., "Color Filter Based on Surface Plasmon Resonance Utilizing Sub-Micron Periodic Hole Array in Aluminum Thin Film", IEICE Trans, Electron., vol. E95-C, No. 2, pp. 251-254, Feb. 2012.

Xu et al., "Plasmonic nanoresonators for high-resolution colour filtering and spectral imaging", Nature Communications, pp. 1-5, 2010.

International Search Report (Form PCT/ISA/210) for International Application No. PCT/JP2014/054866, dated Apr. 8, 2014.

Nims et al., "Development of color filters using surface plasmon resonance," NanotechJapan Bulletin, vol. 3, No. 2, 2010, 8 pages, with a partial English translation.

U.S. Office Action for U.S. Appl. No. 14/779,221, dated Sep. 23, 2016.

* cited by examiner

DIELECTRIC FUNCTION OF Al

DIELECTRIC FUNCTION OF Au

EXAMPLES OF PLASMONIC FILTERS ARRANGED AS RGB SENSOR

PLASMONIC FILTER 101 FOR BLUE
PLASMONIC FILTER 102 FOR RED
PLASMONIC FILTER 103 FOR GREEN

PHOTOELECTRIC CONVERSION DEVICE

TECHNICAL FIELD

The present invention relates to photoelectric conversion devices such as color sensors.

BACKGROUND ART

Human eyes are less sensitive to color changes due to different color temperatures of room lighting. This feature is generally called chromatic adaptation. For example, when one moves from a room with fluorescent lighting which appears bluish, because of a high color temperature, to a room with incandescent lighting which appears yellowish, because of a low color temperature, the white walls of the room initially appear yellowish but appear whitish after a while. Due to such a chromatic adaptation feature of the human visual system, the color of the same image displayed on a television appears different when the color of room lighting is different.

With the recent trend toward higher resolution of liquid-crystal-display televisions, there is an increasing need for the function of finely adjusting the color cast of images in accordance with the type of room lighting, which makes the images look natural regardless of differences in the color temperature of room lighting. Because of this, the installation of a color sensor that detects room color temperature into liquid-crystal-display televisions is being promoted in order to detect room color temperature and automatically control the color cast of images in accordance with chromatic adaptation of the eye. For liquid crystal displays installed in portable devices such as smartphones and tablet PCs (personal computers), surrounding lighting changes continuously depending on the viewing and listening location and thus a sensor that automatically detects color temperature, such as a color sensor, becomes increasingly important.

This color sensor is configured to independently sense the spectra of R (red), G (green), and B (blue), which are three primary colors in the visible light region, in ambient light (the color sensor is hereinafter referred to as an RGB sensor).

The RGB sensor uses plural photoelectric conversion elements in order to sense ambient light, and a device serving as the photoelectric conversion element typically includes a photodiode. These photodiodes themselves cannot identify a color but can only detect the intensity of light (the amount of light). When an image is converted into electrical signals, color signals are acquired with the photodiodes in which each photodiode is covered with a color filter in order to distinguish a color and detecting the amount of light of the three primary colors, namely, R (red), G (green), and B (blue), with each photodiode.

An RGB sensor in the related art typically includes color filters that transmit or reflect only light having a specific wavelength based on interference of light or based on light shielding by absorption of light by a metal material in order to divide ambient light into the three primary colors of light, namely, R (red), G (green), and B (blue).

There is an increasing number of two-dimensional solid-state imaging devices, such as digital still cameras and video cameras, in which an object is captured and converted into an image by a photoelectric conversion element composed of a two-dimensional solid-state image sensor. A CCD (charge coupled device) image sensor and a CMOS (complementary metal oxide semiconductor) image sensor, which are the current mainstream solid-state image sensors, are provided with, on their pixels, R (red), G (green), and B (blue) color filters serving as on-chip filters and are provided with an infrared-cut filter on the package in order to block infrared light, which cannot be blocked by these color filters.

However, the RGB sensor in the related art requires three types of photomasks in order to form color filters that separate three primary colors RGB of light. The requirement of three types of photomasks increases the time and costs of the production process.

To reduce time and costs, there has been proposed a wavelength-selective filter, in place of the color filters, based on the anomalous transmission phenomenon of light due to surface plasmon resonance in which surface plasmons are excited by causing light to enter a periodic structure formed by subjecting a metal thin film to nano-scale micromachining.

A wavelength-selective filter (hereinafter referred to as a plasmonic filter) using the surface plasmon resonance is described in detail in PTL 1. There are various methods for inducing the anomalous transmission phenomenon. For example, there is a method, as shown in FIG. 9, in which an optical filter layer 500 is formed by forming a metal film 501 as thin as about 50 to 200 nm and pattering the metal film 501 so as to have an array of fine holes 502, 502, 502, . . . at a period that depends on the transmission wavelength. FIG. 10 shows the waveform of the spectrum that is transmitted through the optical filter layer 500 when light enters the optical filter layer 500. The surface plasmon resonance occurs due to the resonance between near field light generated by incident light and surface plasmons generated in the interface between a certain conductive material film and a dielectric film. To efficiently induce the surface plasmon resonance, the conductive material film and the dielectric film preferably have a homogeneous structure (uniform in physical properties such as material and refractive index, uniform in hole period and hole shape), and the dielectric film preferably has an optical property of being non-dispersive. The term conductive material film refers to a film that is formed of a metal element that is conductive by itself, has a reflectance of 70% or more in a given wavelength band, and is solid at room temperature, and refers to a film that is formed of an alloy or oxide of the metal element (see NPL 1).

For example, as the metal material, a material selected from the group consisting of aluminum, copper, silver, gold, titanium nitride, zirconium nitride, nickel, and cobalt, and alloys thereof is used.

In particular, aluminum and an alloy of aluminum and copper may often be used because of the following advantages:

(i) the plasma frequency is in the ultraviolet range, and thus the resonance phenomenon occurs in the long-wavelength region beyond visible light;

(ii) aluminum and an alloy of aluminum and copper are materials used in an ordinary semiconductor process and eliminate the need for special devices and materials in view of process integration;

(iii) the materials are inexpensive; and (iv) the production process is simple and optical filters corresponding to different wavelengths are formed together.

Metal oxide transparent conductive materials, for example, $In_2O_3$-based materials typified by ITO ($Sn:In_2O_3$), ZnO-based materials typified by AZO (Al:ZnO), GZO (Ga:ZnO), BZO (B:ZnO), and IZO (In:ZnO), and IGZO-based materials, all of which have a plasma frequency in the range from visible light to near-infrared rays, are also used as materials of surface plasmonic filters because these materials, which have a plasma frequency lower than that of the above metals, are transparent under visible light.

In order to form an RGB sensor including the above plasmonic filters, periodic structures that are each designed to transmit R (red), G (green), or B (blue) color need to be disposed adjacent to each other.

According to NPL 2, when filters are formed to have a thickness of 150 nm by using Al as a metal material and have a periodic structure with a circular hole array, as shown in FIG. 11, the inter-hole periods a are required to be 260 nm for B (blue, wavelength 450 nm) light, 340 nm for G (green, wavelength 550 nm) light, and 420 nm for R (red, wavelength 650 nm) light in order to permit transmission of B (blue), G (green), and R (red) light. The wavelength λ of light to be transmitted and the inter-hole period (lattice constant) a have a linear relationship as shown in FIG. 12. The inter-hole period a varies depending on the metal material and the material of an insulating film around the metal material.

An increase in the number of pixels on CCD image sensors or the like involves a reduction in the size of each pixel and also a reduction in the distance between adjacent pixels. However, as described in PTL 2, filters with different periods need to be formed separately so that each region transmits light having a desired wavelength. If these filters are arranged in a stacking manner, problems arise such that, for example, the filters transmit light having plural wavelengths and the wavelength selectivity decreases and/or the transmissivity at a certain wavelength decreases.

Even if these filters are arranged separately, the following problems arise unless the distance between the filters is set appropriately. An example of the arrangement is shown in FIG. 13 and described. Plasmonic filters 102, 103, and 101 that respectively transmit light having three wavelengths, namely, R (red), G (green), and B (blue), are arranged as shown in FIG. 13. In the plasmonic filter 101, holes are uniformly arranged at an inter-hole period P1. Similarly, holes are uniformly arranged at an inter-hole period P2 in the plasmonic filter 102 and holes are arranged at a constant inter-hole period P3 in the plasmonic filter 103.

When these plasmonic filters 101, 102, and 103 are independently provided, there is only the inter-hole period that permits the transmission of each color of light and a transmission spectrum waveform with good wavelength selectivity is accordingly obtained. However, when the plasmonic filters 101, 102, and 103 are arranged as shown in FIG. 13, in the plasmonic filter 101 and the plasmonic filter 102, the interval a between a hole in the plasmonic filter 101 and a hole in the plasmonic filter 102 is a period a, which is different from the periods P1 and P2, and a small amount of light having wavelengths corresponding to the period a will be transmitted. The same applies to a period b between a hole in the plasmonic filter 102 and a hole in the plasmonic filter 103.

An example of the related art that solves this problem has been proposed in PTL 3. In PTL 3, a period a is made as close as possible to a period P1 of a plasmonic filter 101 and a period P2 of a plasmonic filter 102, so that unintentionally transmitted light has a wavelength closer to a desired wavelength. Specifically, the period a is set to 0.75 to 1.25 times (1.00±0.25) the periods P1 and P2.

CITATION LIST

Patent Literature

PTL 1: Japanese Patent No. 3008931
PTL 2: Japanese Unexamined Patent Application Publication No. 2007-187835
PTL 3: Japanese Unexamined Patent Application Publication No. 2010-170085

Non Patent Literature

NPL 1: Alexandra Boltasseva et al., Sience, Vol. 331, No. 6015, pp. 290-291 (21 Jan. 2011)
NPL 2: Naoki Ikeda et al., IEICE TRANSACTIONS on Electronics, Vol. E95-C No. 2, pp. 251-254 (2012)
NPL 3: NATURE COMMUNICATIONS|DOI: 10.1038/ncomms1058

SUMMARY OF INVENTION

Technical Problem

However, the case of PTL 3 has a problem that, for example, the sizes of P1 and P2 are limited to the range satisfying the existence condition of the period a represented by (Formula 1) described below assuming P2>P1.

$$P2 \times 0.75 < \text{Period } a < P1 \times 1.25 \quad \text{(Formula 1)}$$

For example, the period of the plasmonic filter 102 cannot be set to two times the period P1 of the plasmonic 101 adjacent to the plasmonic filter 102 because the period and the period P1 do not satisfy (Formula 1) described above. Although plasmonic filters have a significant advantage that various plasmonic filters for the wavelengths of RGB and other wavelengths can be simultaneously formed on a metal thin film by freely changing a mask pattern, such an advantage is considerably reduced by a strict restriction on the arrangement, namely, the period as described above.

An object of the present invention is to provide a photoelectric conversion device in which optical filters having different periodic structures can be freely arranged without any strict restriction and which has sufficient wavelength selectivity.

Solution to Problem

In order to achieve the object, a photoelectric conversion device of the present invention includes a first photoelectric conversion element, a second photoelectric conversion element, a first optical filter that has a first pattern periodically having plural structures and is formed of a conductive material film disposed on the first photoelectric conversion element with an insulating film therebetween, and a second optical filter that has a second pattern periodically having plural structures and is formed of a conductive material film disposed on the second photoelectric conversion element with the insulating film therebetween. The interval between the first pattern and the second pattern that are adjacent to each other is longer than a period of the structures in the first pattern and a period of the structures in the second pattern.

Advantageous Effects of Invention

According to the photoelectric conversion device of the present invention, plasmonic filters having different periodic structures can be freely arranged without any strict restriction and highly accurate wavelength selectivity can sufficiently be obtained.

DESCRIPTION OF EMBODIMENTS

Figure 1:
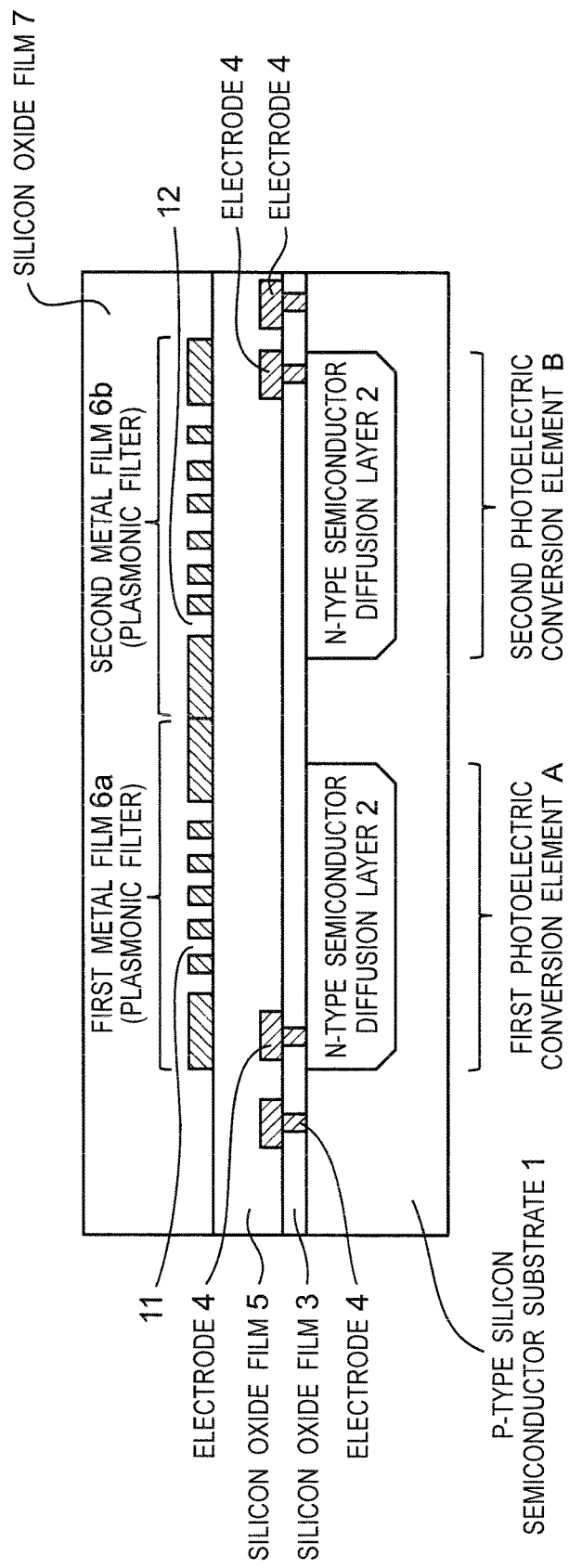
FIG. 1 is a cross-sectional view of a first embodiment of the present invention.

The present invention will be described below in detail by way of embodiments shown in the drawings.

(First Embodiment)

A photoelectric conversion device according to a first embodiment of the present invention will be specifically described with reference to FIG. 1 and FIG. 2.

FIG. 1 shows the cross section of the photoelectric conversion device according to the first embodiment of the present invention. In the photoelectric conversion device, first and second photoelectric conversion elements A and B are provided on a p-type silicon semiconductor substrate 1. The first and second photoelectric conversion elements A and B are formed of silicon photodiodes A and B, respectively. The silicon photodiode A is a p-n junction photodiode A including the p-type silicon semiconductor substrate 1, and an n-type semiconductor diffusion layer 2 and a silicon oxide film 3 which are located on the p-type silicon semiconductor substrate 1. The silicon photodiode B is a p-n junction photodiode B including the p-type silicon semiconductor substrate 1, and an n-type semiconductor diffusion layer 2 and the silicon oxide film 3 which are located on the p-type silicon semiconductor substrate 1. The n-type semiconductor diffusion layers 2 and 2 are formed by introducing phosphorus, arsenic, or the like into the p-type silicon semiconductor substrate 1 by, for example, an ion implantation method, and performing annealing at about 1100° C.

It is noted that no problem arises if the p-n polarities of the semiconductor substrate 1 and the semiconductor diffusion layer 2 are reversed (i.e., the configuration in which a p-type semiconductor diffusion layer is formed on an n-type silicon semiconductor substrate).

On the n-type semiconductor diffusion layers 2 and 2 and the p-type silicon semiconductor substrate 1, the silicon oxide film 3 serving as an insulating film is formed by an ordinary method, such as a CVD (chemical vapor deposition) method. In order to make contact with the silicon photodiodes A and B, the silicon oxide film 3 is provided with openings, in which electrodes 4 are formed with Al, AlCu, or the like by, for example, a sputtering method. Subsequently, a silicon oxide film 5 serving as an insulating film is formed on the silicon oxide film 3 and the electrodes 4 by, for example, a CVD method.

After the silicon oxide film 5 is formed, it is sufficiently planarized by, for example, CMP (chemical mechanical polishing). Since first and second optical filters to be formed on the silicon oxide film 5 (namely, first and second metal films 6a and 6b, which are examples of the following conductive material films serving as first and second surface plasmonic filters) need micromachining of 200 nm or less, it is important to flatten the silicon oxide film 5.

The first and second metal films 6a and 6b serving as the first and second optical filters are plasmonic filters 6a and 6b and respectively have periodic openings 11 and 12, which are examples of periodic structures through which light having a desired wavelength is transmitted. Specifically, the first and second metal films 6a and 6b are formed by depositing Al at a thickness of 150 nm on the flattened silicon oxide film 5 by sputtering. After resist coating is performed on the first and second metal films 6a and 6b, different periodic openings 11 and 12 are formed by photolithography. The openings 11 and 12 are respectively plural circular holes (through-holes) 11 and 12 at a constant period and form an opening pattern. The openings may be recesses instead of holes (through-holes).

Finally, a silicon oxide film 7, which is a dielectric film that functions as a passivation film, is formed on the first and second metal films 6a and 6b and the silicon oxide film 5. Since the holes 11 and 12, which are plural openings in the first and second metal films 6a and 6b formed in the previous process, need to be filled with the silicon oxide film 7 at this time, the silicon oxide film 7 is formed by a high-density plasma CVD method.

Finally, although not shown in FIG. 1, an opening for a pad region is formed.

The photoelectric conversion elements A and B may be CCD image sensors or CMOS image sensors instead of photodiodes.

Figure 2:
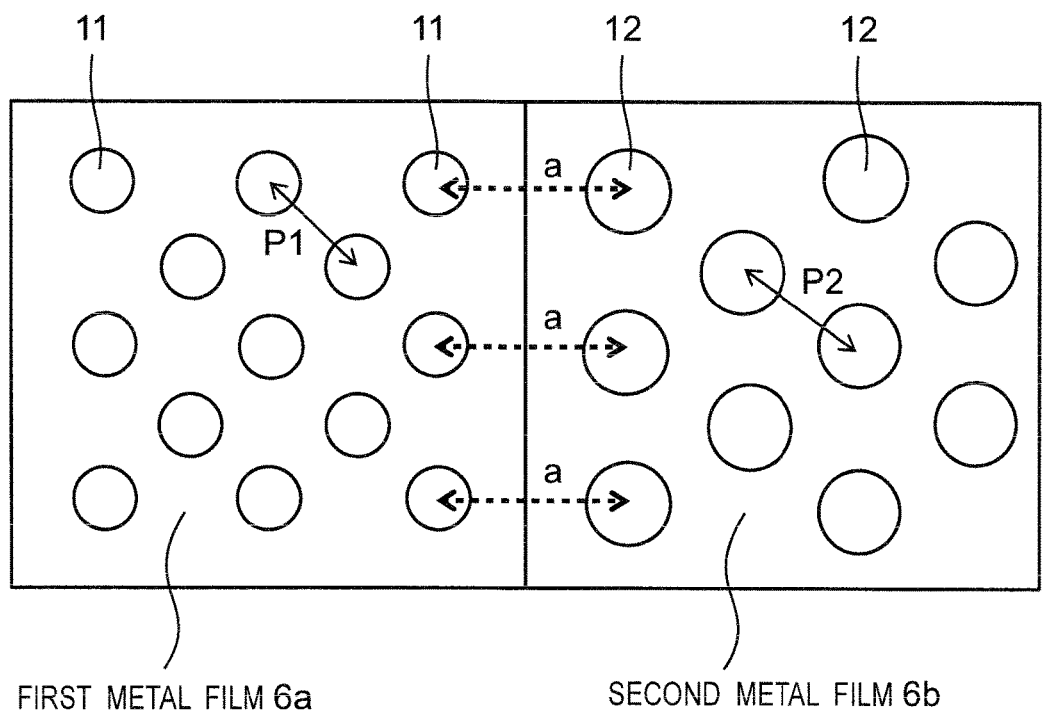
FIG. 2 is a plan view of the first embodiment of the present invention.

Next, FIG. 2 is a top plan view of the photoelectric conversion device according to the first embodiment of the present invention shown in FIG. 1. For example, the first metal film 6a is a surface plasmonic filter serving as a first optical filter that transmits blue ($\lambda$=420 nm) light, whereas the second metal film 6b is a surface plasmonic filter serving as a second optical filter that transmits red ($\lambda$=630 nm) light. The period P1 of the openings 11 in the first metal film 6a and the period P2 of the openings 12 in the second metal film 6b depend on the metal materials of the first and second metal films 6a and 6b serving as the first and second optical filters and the refractive indices of the surrounding dielectric films 7 and 5. Conversely, the surface plasmonic filters each have the following characteristic: theoretically, the wavelength of light to be transmitted thorough it is governed by the conductive material of the surface plasmonic filter, the surrounding dielectric films, and the periodic structure. In the surface plasmonic filters in the first embodiment of the present invention, the conductive material is Al, the dielectric films are made of $SiO_2$, and the periods P1 and P2 of the openings 11 and 12 are 260 nm and 420 nm, respectively. That is, in FIG. 2, P1=260 nm and P2=420 nm.

Figure 3:
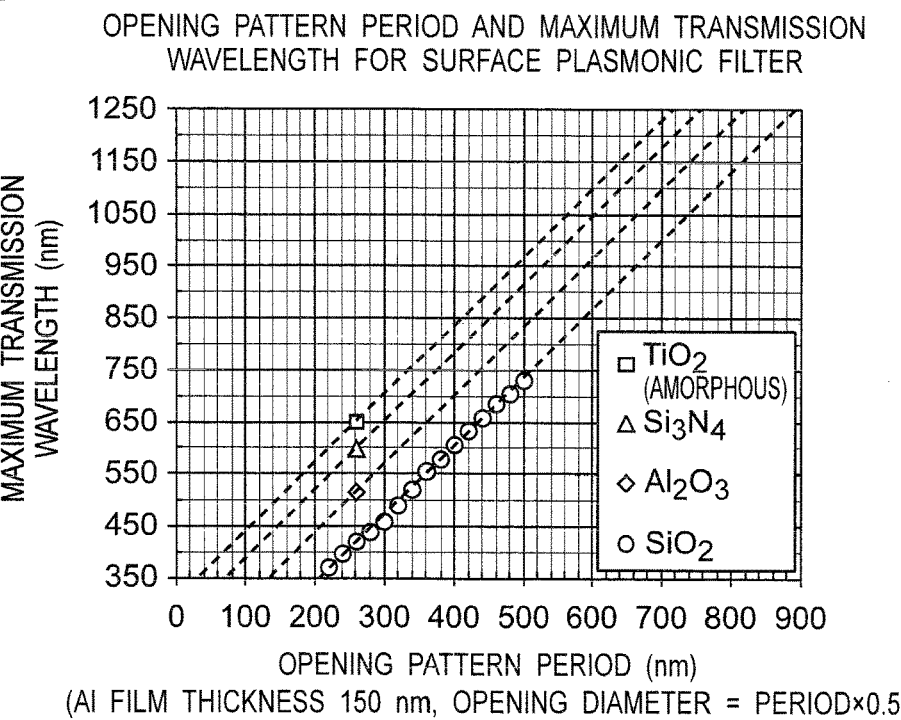
FIG. 3 is a graph showing the opening pattern period and the maximum transmission wavelength of a surface plasmonic filter.
Figure 4:
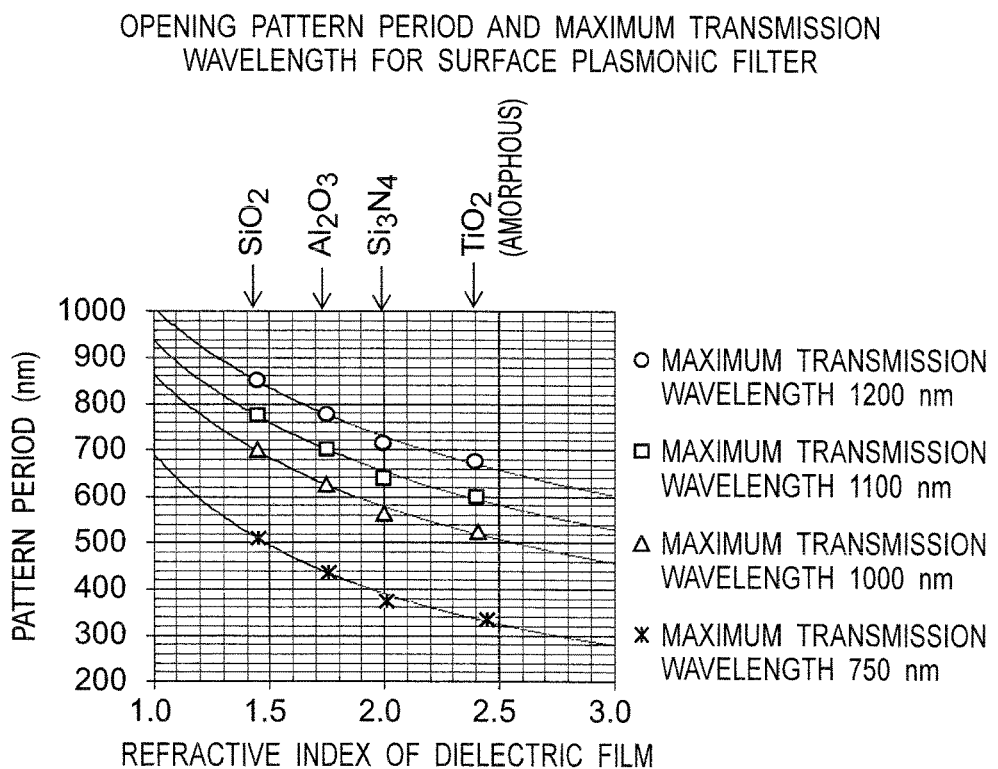
FIG. 4 is a graph showing the opening pattern period and the maximum transmission wavelength of a surface plasmonic filter.

FIG. 3 shows the relationship among the period of the opening pattern, the transmission wavelength, and the dependence on the dielectric material for the first and second metal films 6a and 6b serving as the first and second optical filters in FIG. 2. The results are obtained by using Al for the conductive material films and materials having a different refractive index ($SiO_2$, $Al_2O_3$, $Si_3N_4$, and $TiO_2$) for the dielectric films. A large period of the opening pattern results in a large maximum transmission wavelength based on the linear relationship. FIG. 4 shows the relationship between the maximum transmission wavelength and the refractive index of the dielectric film obtained from FIG. 3. It is shown that, at the same maximum transmission wavelength, the pattern period decreases with increasing refractive index of the dielectric film. That is, it is indicated that the interval between adjacent optical filters decreases with increasing refractive index of the dielectric film.

Figure 5:
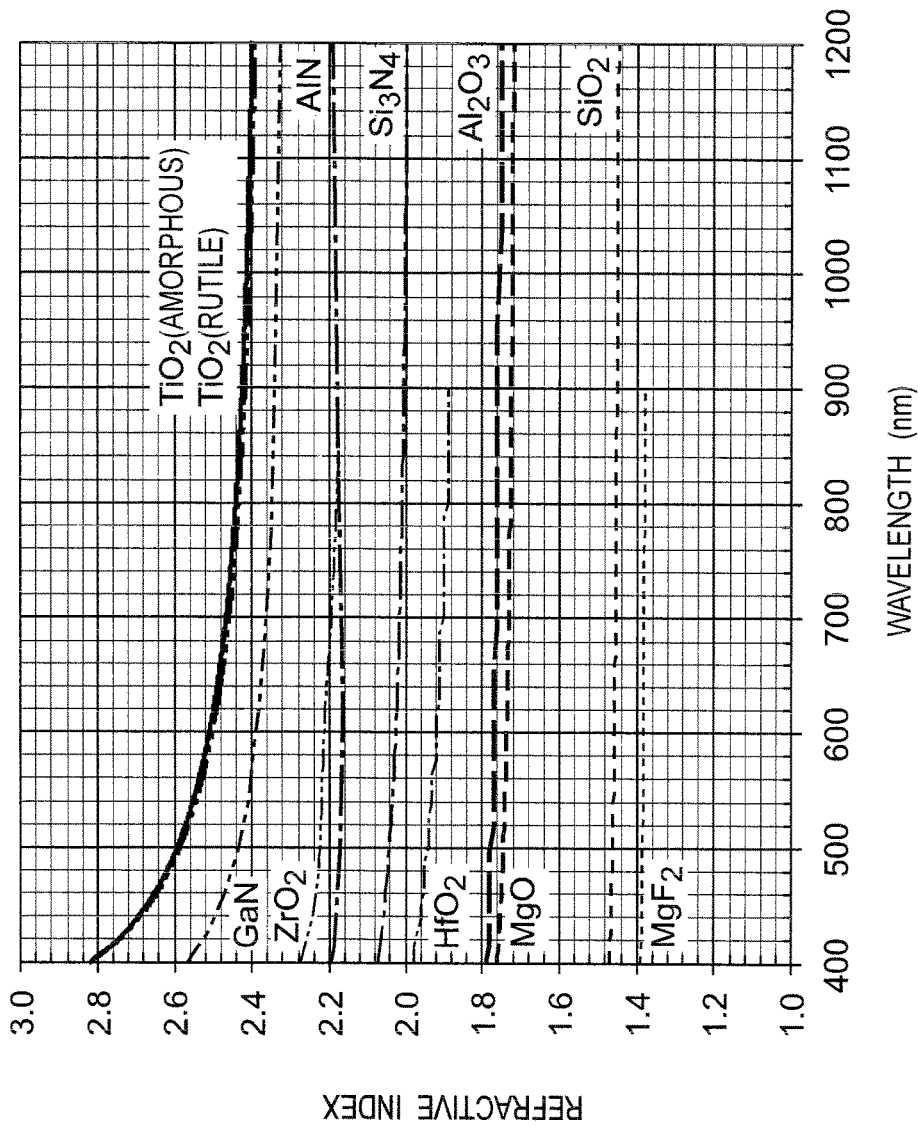
FIG. 5 is a graph showing the wavelength dependence of the refractive index of dielectric materials.

FIG. 5 shows the wavelength dependence of the refractive index of the dielectric materials. The dielectric materials described in FIG. 5 are examples of materials expected as the material of the dielectric film for the surface plasmonic filter and are substantially non-dispersive materials in the wavelength region shown in the drawing. This indicates that the refractive index of the dielectric film for the surface plasmonic filter ranges from 1.0 to 3.0.

Therefore, when the surface plasmonic filters 6a and 6b shown in FIG. 2 are disposed adjacent to each other, and the interval a between a hole 11 being an opening in the first metal film 6a and a hole 12 being an opening in the second metal film 6b, namely, the interval a between a first pattern of periodic plural openings 11 in the first optical filter 6a and a second pattern of periodic plural openings 12 in the second optical filter 6b is as small as, for example, only 340 nm, green ($\lambda$=550 nm) light is transmitted based on surface plasmon resonance at this period. This means that green color is transmitted through the boundary area between the first metal film 6a and the second metal film 6b although only blue color should be transmitted through the region of the first metal film 6a and only red color should be transmitted through the region of the second metal film 6b. When this phenomenon occurs, each region does not properly recognize color. For example, if the color temperature is intended to be sensed by an RGB sensor or the like, proper detection cannot be achieved and improper correction will be made.

In contrast, in the first embodiment, the silicon photodiodes A and B are used as the photoelectric conversion elements A and B. Since silicon can absorb only light of up to about 1200 nm because of its physical properties, the size of the period a between the holes 11 and 12 in the boundary area between the first metal film 6a and the second metal film 6b is designed such that the wavelength of light transmitted at the period a is 1200 nm or more. Specifically, when the interval a between the first pattern of the openings 11 in the first optical filter 6a and the second pattern of the openings 12 in the second optical filter 6b, namely, the interval a between the hole 11 and the hole 12 is about 600 nm or more, which is larger than the periods P1 and P2, the wavelength of light transmitted in surface plasmon resonance due to the holes 11 and 12 in the boundary area is longer than 1200 nm, and thus the light cannot be detected by the photoelectric conversion elements A and B composed of the silicon photodiodes A and B and, for example, detection of deviated color temperature does not occur.

Therefore, according to the first embodiment, highly accurate wavelength selectivity can be obtained.

According to the first embodiment, for example, as long as the hole 11 and the hole 12 are distant from each other about 600 nm or more as described above, the first and second optical filters having different periodic structures 11 and 12, namely, the surface plasmonic filters 6a and 6b can be freely arranged without any strict restriction.

(Second Embodiment)

A photoelectric conversion device according to a second embodiment is different only in the materials of photoelectric conversion elements and the conductive materials of first and second optical filters, namely, first and second metal films. Therefore, FIG. 2 for the first embodiment is used to describe the second embodiment.

The silicon photodiodes A and B are used as the photoelectric conversion elements A and B in the first embodiment of the present invention as described above. Alternatively, other materials can also be obviously used. In this case, the maximum wavelength $\lambda$max of light that is absorbable by each material shown in Table 1 and the inter-hole period that prevents the transmission of the light vary with the physical property (band gap) of each material. An approximate maximum wavelength $\lambda$max is obtained from (Formula 2) described below.

TABLE 1

List of Physical Property (Band Gap) of Crystal Materials

| Crystal Material | Band Gap [eV] | $\lambda$max [nm] | Period [nm] |
|---|---|---|---|
| Si | 1.12 | 1100 | 600 |
| Ge | 0.7 | 1770 | 1350 |
| GaAs | 1.43 | 870 | 400 |
| GaN | 3.4 | 370 | 80 |

$$\lambda max\ [nm] \approx 1240/Ea \quad \text{(Formula 2)}$$

where Ea is a band gap [eV].

Therefore, for Si, the period a between the holes 11 and 12 in the boundary area is 600 nm or more. However, for example, for Ge which has a small band gap among the materials in Table 1, the maximum transmission wavelength is as long as 1770 nm and thus the period a needs to be 1350 nm or more. For GaAs and GaN which have a large band gap, the period a between the holes 11 and 12 in the boundary area can be shortened to 400 nm and 80 nm. The arrangement of the holes 11 and 12 with a distance of the above period or more does not cause any problems associated with the characteristics. However, the arrangement with an excessively long distance results in a large interval between the optical filters and a large size of the entire color sensor, which causes problems of an increase in costs and difficulty in size reduction. In this case, for example, for Si, holes are desirably arranged at a period of 600 nm, which is the minimum value of an almost appropriate inter-hole period.

For example, when GaAs is used as another material for the photoelectric conversion element, GaAs is a III-V semiconductor, and thus an n-type semiconductor layer is formed by doping GaAs with $Se^{6+}$ or the like and a p-type semiconductor is formed by doping GaAs with $Zn^{2+}$ or the like. A p-n junction of GaAs is formed accordingly and, as a result, a photoelectric conversion layer is formed.

When hole-array-type plasmonic filters 6a and 6b formed of Al, which is the same as in the first embodiment, are formed on the photoelectric conversion layer, the period a between the holes 11 and 12 in the boundary is desirably about 400 nm.

Because of this, as in the first embodiment, transmissions of light having different wavelengths are independently allowed and light transmitted through the boundary area is not absorbed by the photoelectric conversion elements A and B. As a result, a photoelectric conversion device can be obtained which has highly accurate wavelength selectivity, which can transmit light having different wavelengths, and in which the plasmonic filters 6a and 6b are arranged without any strict restriction.

The conductive materials of the optical filters, namely, the surface plasmonic filters 6a and 6b, in the second embodiment are materials selected from the group consisting of aluminum, copper, silver, gold, titanium nitride, zirconium nitride, nickel, and cobalt, and alloys thereof. The conductive materials are desirably selected from metal oxide transparent conductive materials, for example, $In_2O_3$-based materials typified by ITO ($Sn:In_2O_3$), ZnO-based materials typified by AZO (Al:ZnO), GZO (Ga:ZnO), BZO (B:ZnO), and IZO (In:ZnO), and IGZO-based materials, all of which are transparent under visible light and highly reflective under infrared (the plasma frequency is 380 THz or less).

(Third Embodiment)

In the first and second embodiments of the present invention, the cases where the material of the plasmonic filters is Al, the dielectric films around the patterns of the optical filters are silicon oxide films, and a circular hole array is formed are described in detail. However, Au, Ag, Cu, and other metals can be used as the filter material in addition to Al, and the dielectric films may be silicon nitride films or may be made of other materials. FIGS. 1 and 2 for the first embodiment are used for a photoelectric conversion device according to a third embodiment except for the material and the size.

Figure 6:
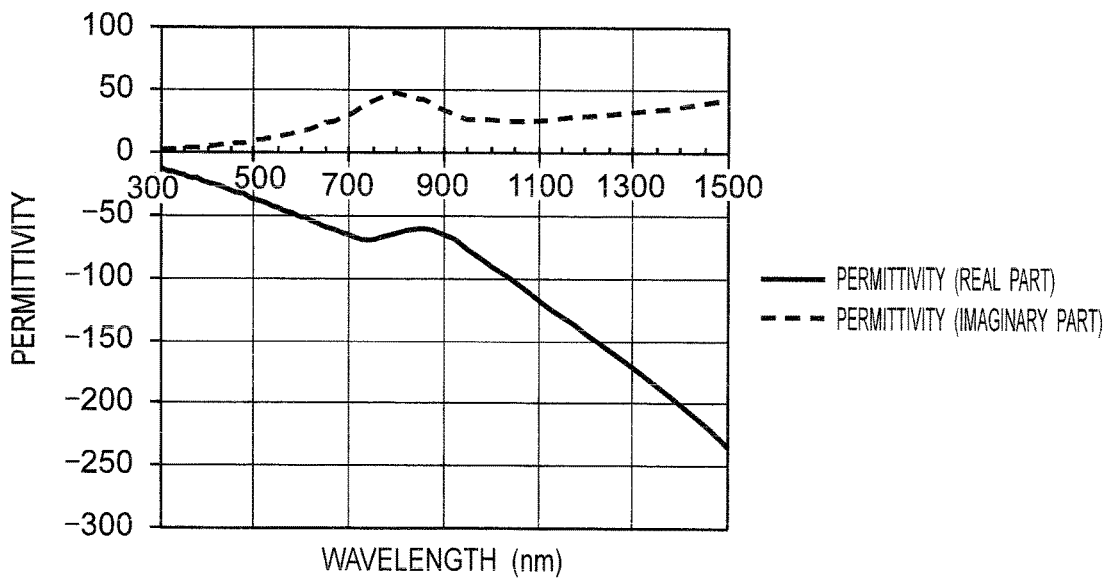
FIG. 6 is a graph showing the dielectric function of Al.
Figure 7:
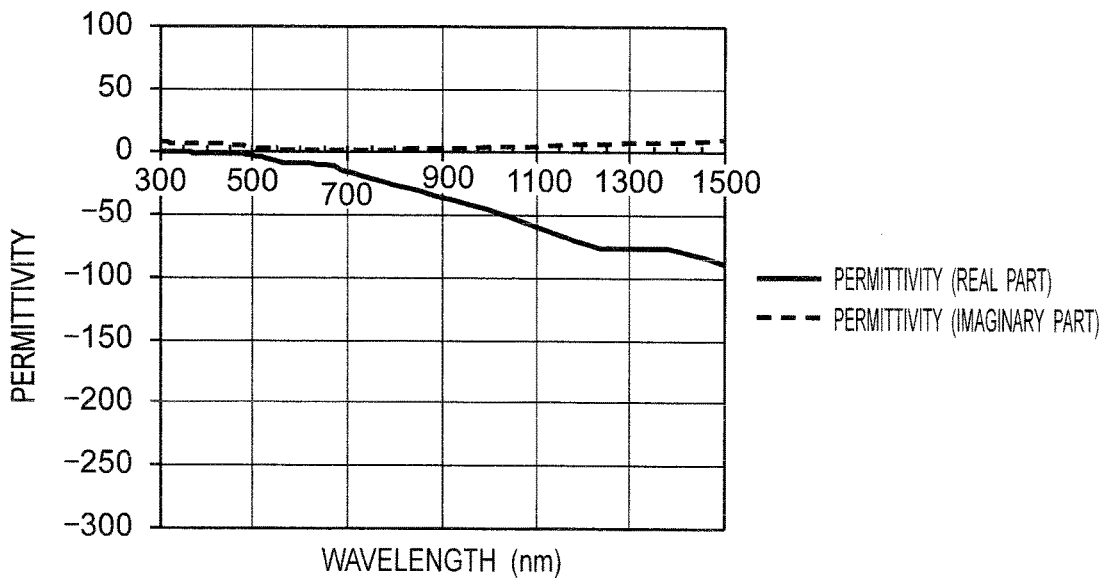
FIG. 7 is a graph showing the dielectric function of Au.

In the third embodiment of the present invention, the case where Au rather than Al is used as the material of the plasmonic filters 6a and 6b is described. An advantage for using an Al-based material for the plasmonic filter is described above, but an Al-based material has a disadvantage of a weak plasmon resonance effect under light having wavelengths as long as several micrometers. The effect of surface plasmon resonance is notably affected by the dielectric function (complex dielectric function for metal) of the metal material used for the optical filter. In particular, the larger the absolute value of the real part of the dielectric function is, the smaller the absolute value of the imaginary part of the dielectric function is, the more desirable the dielectric function is. In particular, the absolute value of the imaginary part of the dielectric function is important. However, FIG. 6 and FIG. 7 show the dielectric functions of Al and Au and indicate that the absolute value of the imaginary part of the dielectric function in the long wavelength range of several micrometers for an Al-based material is larger than those for Au, Ag, Cu, and the like. It is shown that the surface plasmon resonance effect is unlikely to occur when the absolute value of the imaginary part of the dielectric function is large. In the long wavelength range of about several micrometers, it is preferable to use Au and Ag rather than an Al-based material. Regarding the interval between adjacent independent plasmonic filters 6a and 6b, as described in the first embodiment of the present invention, the plasmonic filters 6a and 6b formed of Au are arranged at an interval such that the wavelength of light transmitted through the plasmonic filters 6a and 6b is the wavelength of light that cannot be absorbed by the material of the underlying photoelectric conversion elements A and B, which provides the same advantages as those in the first embodiment of the present invention.

(Fourth Embodiment)

Figure 8:
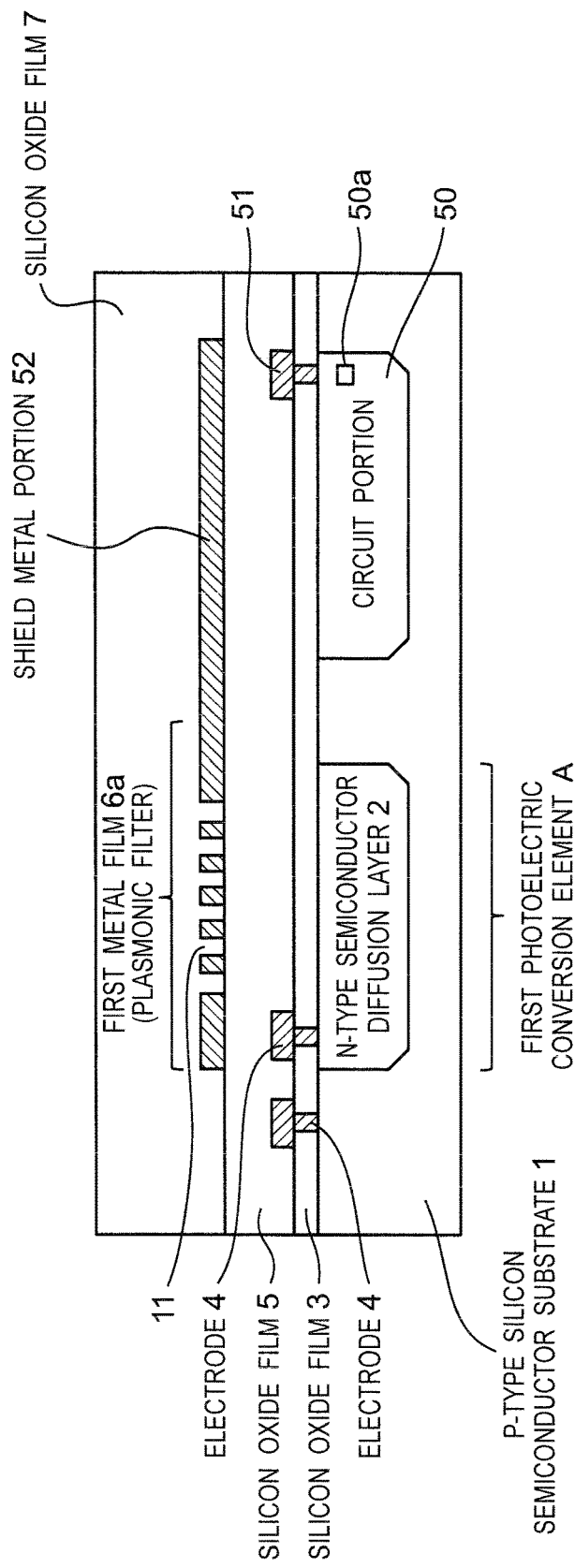
FIG. 8 is a cross-sectional view of a fourth embodiment of the present invention.
Figure 9:
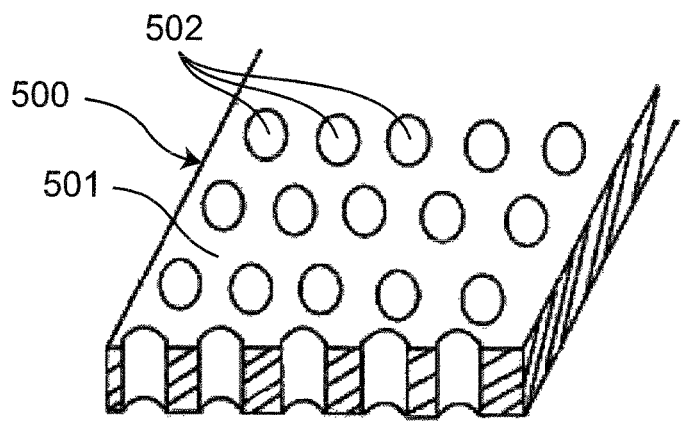
FIG. 9 is a view showing an embodiment in PTL 1.
Figure 10:
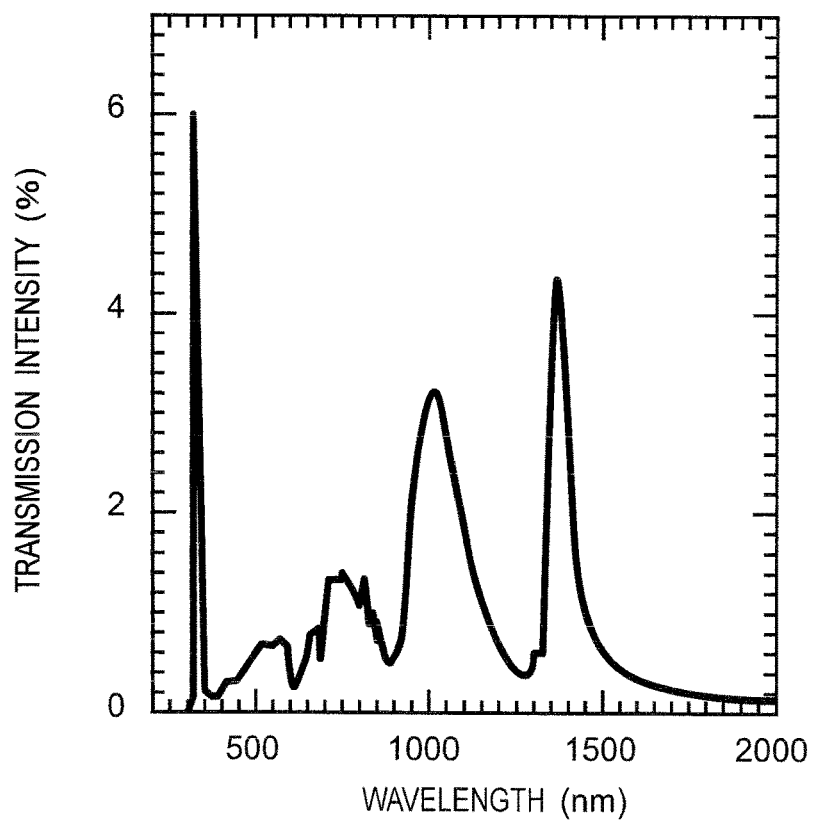
FIG. 10 is a graph showing the transmission spectrum waveform in PTL 1.
Figure 11:
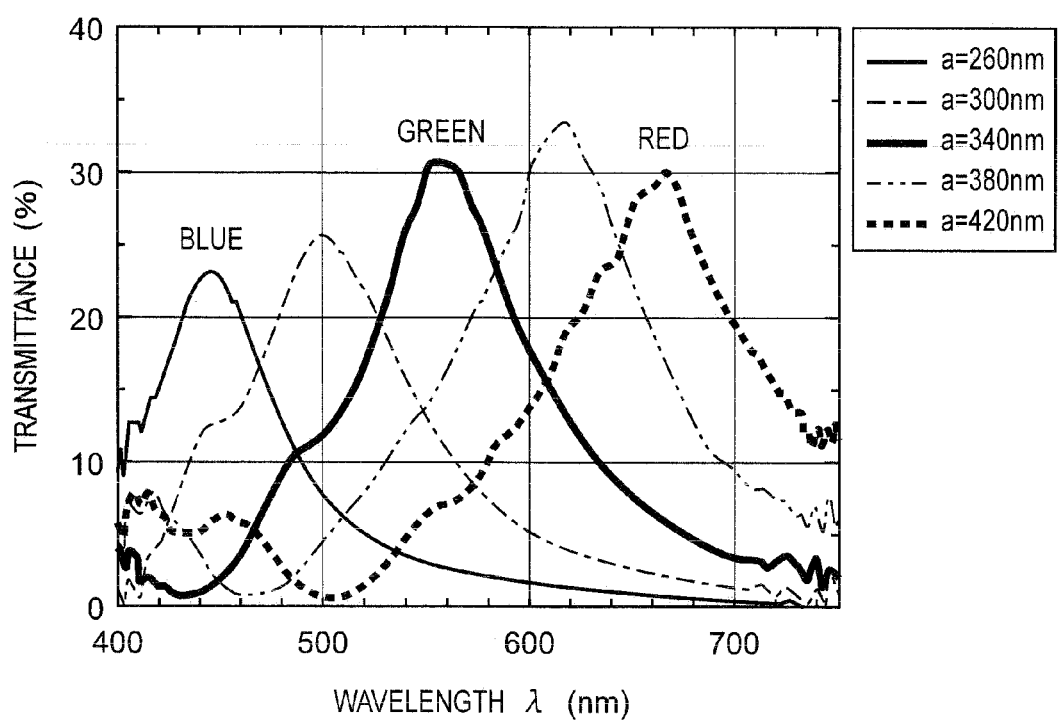
FIG. 11 is a graph showing the wavelength selectivity in NPL 1.
Figure 12:
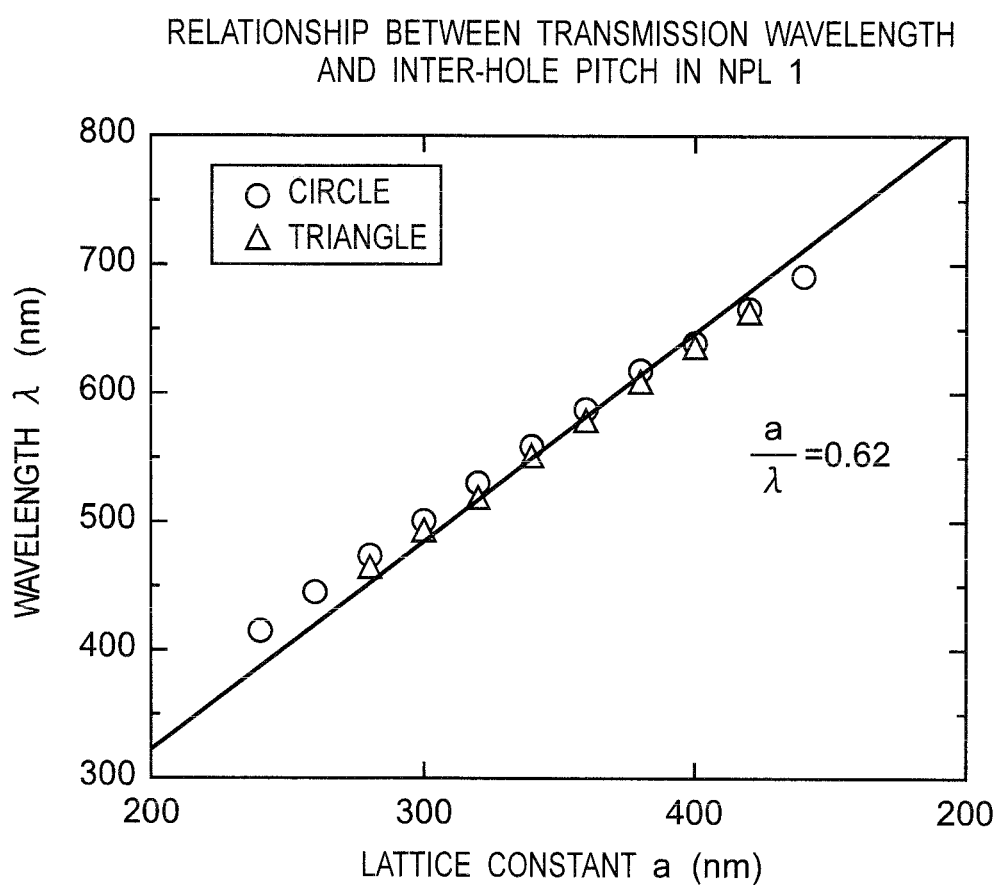
FIG. 12 is a graph showing the relationship between the transmission wavelength and the inter-hole period in NPL 1.
Figure 13:
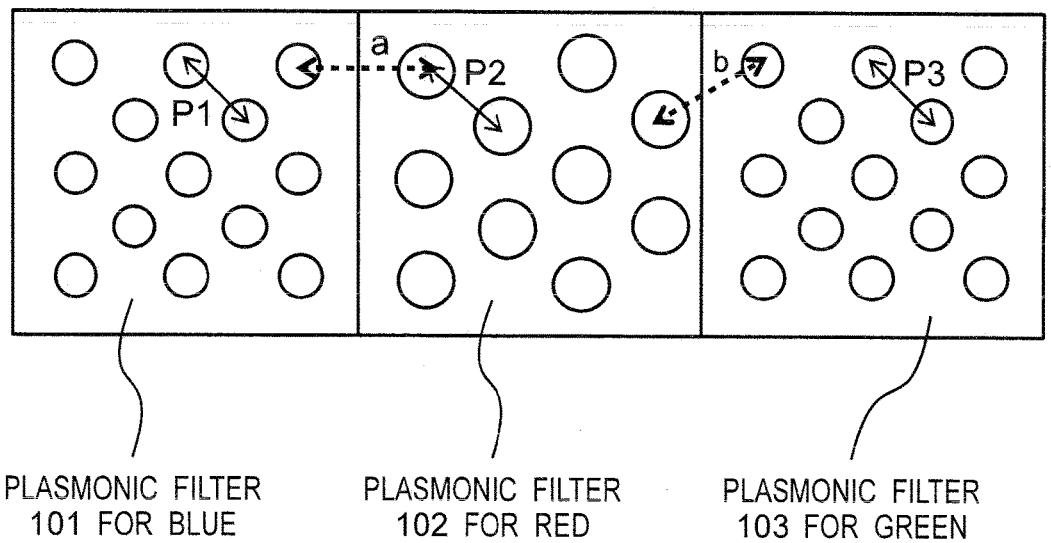
FIG. 13 is a view showing examples of plasmonic filters arranged as an RGB sensor.

FIG. 8 is a cross-sectional view of a photoelectric conversion device according to a fourth embodiment. In FIG. 8, the same components as those in FIG. 1 for the first embodiment are denoted by the same reference numerals. A detailed description of the same components is omitted and different components will be described below.

Although the second photoelectric conversion element B and the second metal film 6b shown in FIG. 1 are not illustrated in FIG. 8, they are located behind the first photoelectric conversion element A and the first metal film 6a in FIG. 8.

As shown in FIG. 8, a circuit portion 50 is provided on a p-type silicon semiconductor substrate 1 and electrically coupled to a wiring layer 51. The circuit portion 50 performs signal processing on outputs from the first and second photoelectric conversion elements A and B and, for example, determines the hue of ambient light. Thus, the circuit portion 50 that performs signal processing on the outputs from the photoelectric conversion elements A and B is integrated with the photoelectric conversion elements A and B, resulting in achievement of noise reduction and size reduction.

The circuit portion 50 includes an electrostatic protection element 50a.

A shield metal portion 52 is provided in the same layer as that of the first metal film 6a. The shield metal portion 52 covers the circuit portion 50 and a region between the circuit portion 50 and the first photoelectric conversion element A. The shield metal portion 52 thus inhibits stray light from entering the first and second photoelectric conversion elements A and B and the circuit portion 50 and eliminates or reduces generation of spurious signals, resulting in reduced malfunction and improved durability.

As shown in FIG. 8, the plasmonic filter 6a formed of the first metal film 6a and the shield metal portion 52 are continuous with each other to reduce the amount of deposit generated during etching. Although not shown, the plasmonic filter 6a and the shield metal portion 52 may be separated from each other rather than continuous with each other.

The first and second metal films 6a and 6b and the shield metal portion 52 are grounded via wiring (not shown) to earth potential. Because of this, the first and second metal films 6a and 6b and the shield metal portion 52 not only cut off light but also have a shielding effect against electric noises. For example, when an electric noise reaches the first and second metal films 6a and 6b or the shield metal portion 52, the electric noise can escape to earth potential. The electric noise thus does not adversely affect the circuit portion 50 and the electrostatic protection element 50a under the first and second metal films 6a and 6b and the shield metal portion 52. That is, the shield metal portion 52 functions as an optical shield for inhibiting entry of light and an electric shield for protecting the circuit portion 50 and the like from electric noises.

In the first and second embodiments, the periodic structures provided in the first and second metal films 6a and 6b serving as the optical filters are respectively arrays of the circular holes 11 and 12. In addition to the circular hole array, an array structure with holes having a quadrilateral or triangular shape or other shapes, line and space structures, and a projected periodic structure using localized plasmons even may induce the surface plasmon resonance phenomenon. However, the wavelength at which the resonance occurs varies with the material and the structure and thus the arrangement of the periodic structures of adjacent optical filters needs to be optimized in consideration of the physical property (λmax) of each photoelectric conversion element used according to each parameter.

In the first and second embodiments, the first and second photoelectric conversion elements A and B are provided on the semiconductor substrate 1. However, in addition to the first and second photoelectric conversion elements A and B and the first and second metal films 6a and 6b, a third photoelectric conversion element (not shown) may be provided and a third metal film serving as a third optical filter may be provided on the third photoelectric conversion element with an insulating film therebetween, and three primary colors of light, R (red), G (green), and B (blue), or complementary colors of light for the three primary colors may be detected by passing the three primary colors of light or complementary colors of light for the three primary colors through the first, second, and third optical filters.

(Fifth Embodiment)

Figure 14:
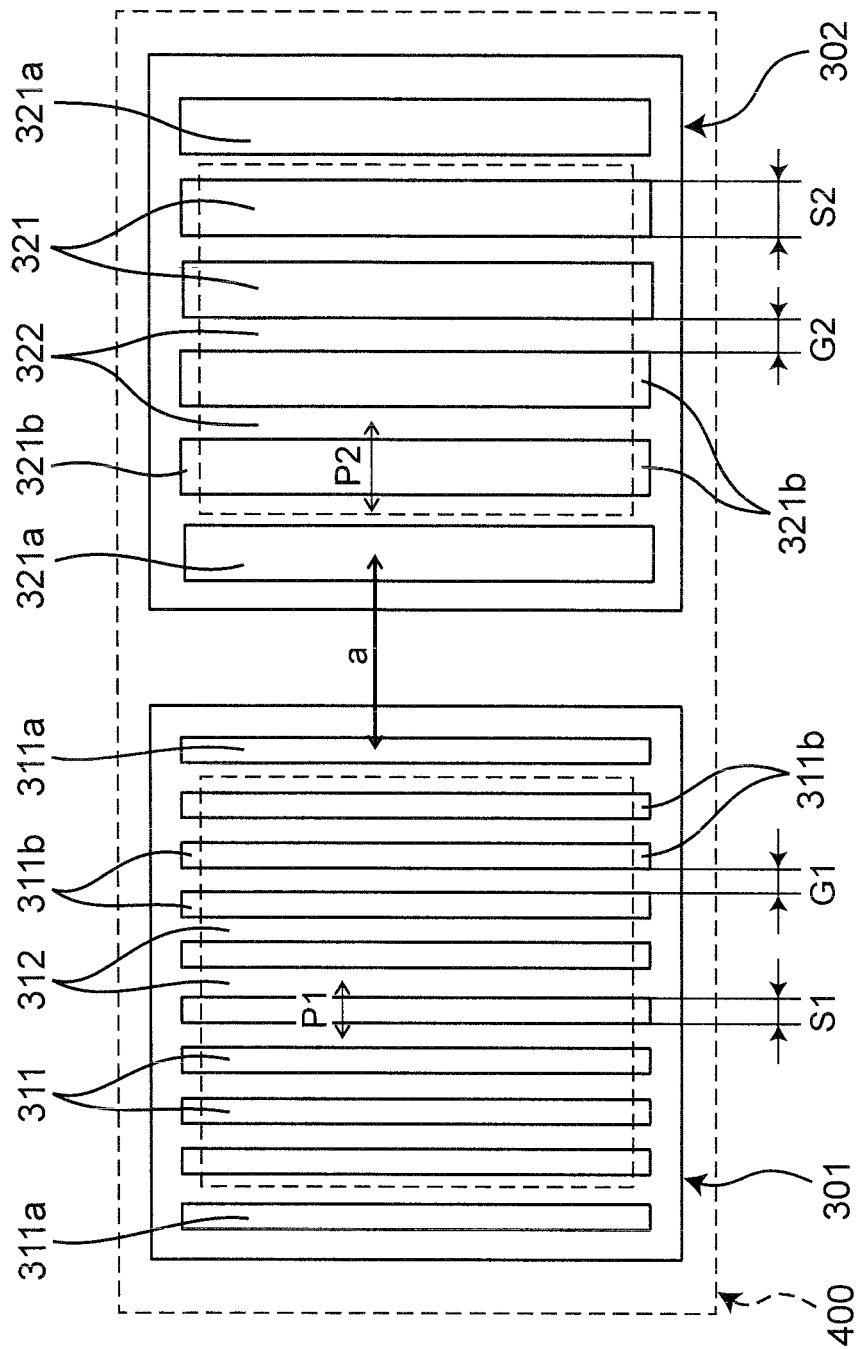
FIG. 14 is a plan view of a fifth embodiment of the present invention.

FIG. 14 is a plan view of a photoelectric conversion device according to a fifth embodiment of the present invention.

The periodic structure in the fifth embodiment is a slit structure instead of the circular hole array structure described above in the first to fourth embodiments.

In the photoelectric conversion device in the fifth embodiment, as shown in the plan view of FIG. 14, a first metal film 301, which is a conductive material film serving as a first optical filter, and a second metal film 302, which is a conductive material film serving as a second optical filter, are disposed adjacent to each other. A third metal film 400, which is a conductive material film, is provided under the first and second metal films 301 and 302 with an insulating layer (not shown) therebetween.

Since the structure under the third metal film 400 is the same as the structure including the silicon nitride film 5 and the like in the first embodiment shown in FIG. 1, this structure is referred to in FIG. 1 and a detailed description thereof is omitted.

As shown in FIG. 14, plural slits 311, 311, 311, . . . , which are examples of plural openings that form a first pattern, are provided in the first metal film 301 serving as the first optical filter. The plural slits 311, 311, 311, . . . are laterally arranged at a constant interval, namely, a constant period (pitch) P1 and have a width S1. In addition, strips 312, 312, 312, . . . on both sides of the slits 311 also have a constant period (pitch) P1 and have a width G1.

Plural slits 321, 321, 321, . . . , which are examples of plural openings that form a second pattern, are provided in the second metal film 302 serving as the second optical filter. The plural slits 321, 321, 321, . . . are laterally arranged at a constant interval, namely, a constant period (pitch) P2 and have a width S2. In addition, strips 322, 322, 322, . . . on both sides of the slits 321 also have a constant period (pitch) P2 and have a width G2.

The first and second metal films 301 and 302 serving as the first and second optical filters are plasmonic filters.

The interval a between the rightmost slit 311a in the first metal film 301 serving as the first optical filter and the leftmost slit 321a in the second metal film 302 serving as the second optical filter (the distance between the center line of the slit 311a and the center line of the slit 321a) is larger than the periods P1 and P2. Because of this, the photoelectric conversion elements A and B composed of the silicon photodiodes A and B shown in FIG. 1 cannot detect the wavelength of light transmitted by surface plasmon resonance due to the slits 311a and 321a in the boundary area and detection of deviated color temperature does not occur.

Therefore, according to the fifth embodiment, highly accurate wavelength selectivity can be obtained.

The third metal film 400 provided under the first and second metal films 301 and 302 with the insulating layer (not shown) therebetween generally has a rectangular periphery and two rectangular openings and covers the entire region of the slits 311a and 311a in both ends of the first metal film 301, the entire region of the slits 321a and 321a in both ends of the second metal film 301, the region between the first metal film 301 and the second metal film 302, and both longitudinal end portions 311b, 321b, . . . of each of the plural slits 311, 321, other than slits in both ends of the first and second metal films 301 and 302. That is, the third metal film 400 covers the outermost portions of the plural slits 311, 321, . . . in the first and second metal films 301 and 302.

Since the third metal film 400 accordingly covers the outermost portions of the plural slits 311, 321, . . . in the first and second metal films 301 and 302, the third metal film 400 can cut off light transmitted through both longitudinal end portions 311b, 321b, . . . of each of the slits 311, 321, . . . and the slits 311a and 321a in both ends which tend to have an uneven shape because of the effect of interference light from the adjacent opening during exposure and the microloading effect during etching. Even with the slit structure, plasmonic filters having desired wavelength selectivity can be formed.

Therefore, according to the photoelectric conversion device in the fifth embodiment, the anomalous transmission of light having a wavelength that is supposed not to be transmitted can be inhibited, and the half band width of the spectrum waveform can be reduced.

The first and second metal films 301 and 302 are grounded via wiring (not shown) to earth potential.

Since the first and second metal films 301 and 302 are at earth potential, the potential of the first and second metal films 301 and 302, which form the plasmonic filter region, is stable and the behavior of electrons is stable to provide good wavelength selectivity. If the potential of the first and second metal films 301 and 302 in the plasmonic filter region varies, the wavelength selectivity is adversely affected.

According to the photoelectric conversion device having the above configuration, the effect of the wavelength selection based on the plasmonic effect as in the first to fourth embodiments is also observed even with the slit structure by appropriately selecting the periods (pitches) P1 and P2, the slit widths S1 and S2, and the interval a.

Figure 15:
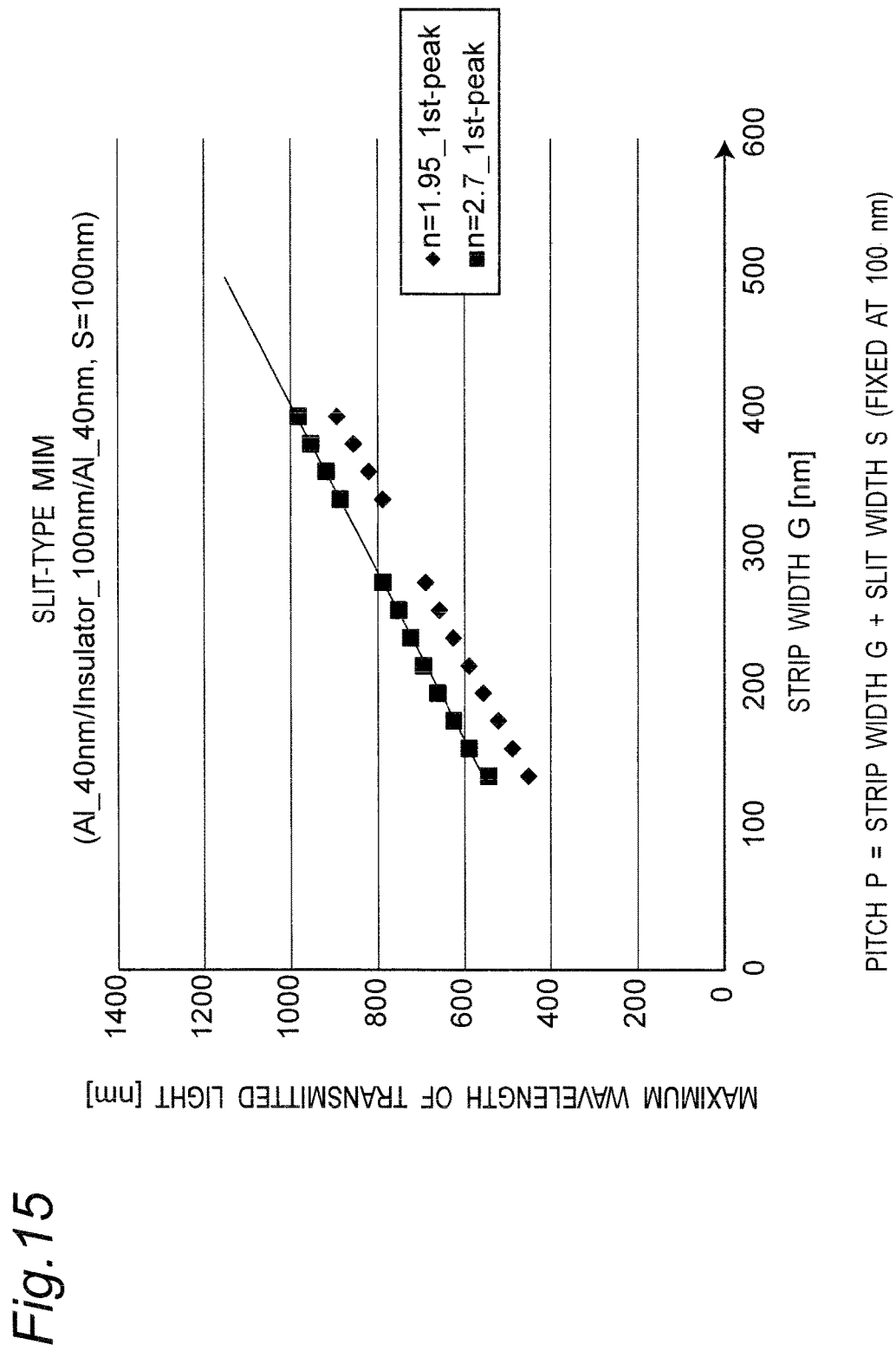
FIG. 15 is a graph showing the relationship between the strip width and the maximum transmission wavelength in a slit structure according to a fifth embodiment of the present invention.

FIG. 15 shows an experimental example in which a slit-type MIM (Metal-Insulator-Metal) structure specifically including a 40-nm-thick Al film, a 100-nm-thick insulating film, and a 40-nm-thick Al film is used and the slit width S is fixed at 100 nm.

FIG. 15 indicates that the maximum wavelength of transmitted light is varied by changing the strip width G and thus changing the pitch P even at the same slit width S (100 nm). This means that when plasmonic filters are even formed of the same metal material or the same insulation material and the plasmonic filters are disposed adjacent to each other, the distance a between the slits of both the plasmonic filters (see FIG. 14) which does not cause interference between these adjacent plural plasmonic filters changes.

More specifically, the photoelectric conversion device is produced as follows. Photoelectric conversion elements for converting incident light into electrical signals are formed on a silicon substrate by ordinary processes, such as lithography and ion implantation, mainly using a silicon material, which is typically used for semiconductors, and interlayer films of SiO$_2$ are formed, followed by sufficient flattening by a CMP method or the like. Subsequently, with reference to the stacked structure including a 40-nm-thick film made of Al, a 100-nm-thick insulating film made of ZnSe, and a 40-nm-thick film made of Al, which is the structure shown in NPL 3 (NATURE COMMUNICATIONS | DOI: 10.1038/ncomms1058), a filter film is formed by changing the insulating film from the film made of ZnSe into a film made of SiN, which is typically used in a semiconductor process. FIG. 15 shows the dependence of the transmission wavelength of the plasmonic filter on the strip width G at two refractive indices (n=1.95, n=2.7). For example, when the refractive index n is 2.7, filters for blue (B), green (G), and red (R) can be formed by forming slit structures where strip widths G for an RGB sensor are 100 nm, 150 nm, and 200 nm (pitches P are 200 nm, 250 nm, and 300 nm because a slit width S is constant at 100 nm).

When these plasmonic filters are disposed adjacent to each other, the plasmonic filters are arranged with a distance of 450 nm or more, which is a filter pitch that allows transmission of light having a wavelength of 1100 nm, which is the maximum wavelength λmax of light that is absorbable by silicon. With this arrangement, color filters that transmit light having a given wavelength and have good color separability can be disposed adjacent to each other without transmission of extra light that will become a noise as a result of absorption by silicon in the boundary between adjacent color filters like the circular hole array-type filters described above.

The slit-type filter having a stacked structure of Al, SiN, and Al is described above. The same applies to other stacked structures and periodic structures although different pitches and minimum separation distances are employed. It is essential to dispose plural filters different in the periodic structure so as to be separated from each other with a larger distance than the pitch that allows transmission of light having a maximum transmission wavelength in the photoelectric conversion material employed although the pitch for transmission of desired light, which is determined according to the materials and the planar periodic structure, varies.

The components in the fifth embodiment may be appropriately combined with the components in the first to fourth embodiments.

The present invention and the embodiments are summarized as follows.

A photoelectric conversion device of the present invention includes:

a first photoelectric conversion element A;

a second photoelectric conversion element B;

a first optical filter 6a or 301 that has a first pattern periodically having plural structures 11 or 311 and is formed of a conductive material film disposed on the first photoelectric conversion element A with an insulating film 5 therebetween; and a second optical filter 6b or 302 that has a second pattern periodically having plural structures 12 or 321 and is formed of a conductive material film disposed on the second photoelectric conversion element B with the insulating film 5 therebetween.

The interval a between the first pattern and the second pattern that are adjacent to each other is longer than a period P1 of the structures 11 or 311 in the first pattern and a period P2 of the structures 12 or 321 in the second pattern.

There is no upper limitation on the interval a between the first pattern and the second pattern and even a long interval a does not cause any problem. The interval a is an interval at which light in a wavelength range that is absorbable by at least one of two photoelectric conversion elements A and B cannot be substantially transmitted. In addition, the interval a is preferably a minimum interval that satisfies the above conditions in view of integration. For example, the size of the interval a varies with the refractive index of a dielectric. When the refractive index of the dielectric expected from FIG. 4 is 1.0 to 3.0, the interval a is in the range of about 600 to 5000 nm.

According to the photoelectric conversion device having the above configuration, the interval a between the first pattern of the structures 11 or 311 in the first optical filter 6a and the second pattern of the structures 12 or 321 in the second optical filter 6b is longer than the period P1 of the structures 11 or 311 in the first pattern and the period P2 of the structures 12 or 321 in the second pattern. Therefore, light in a wavelength range that is absorbable by at least one of the first and second photoelectric conversion elements A and B is not transmitted based on surface plasmon resonance between the structures 11 or 311 in the first optical filter 6a or 301 and the structures 12 or 321 in the second optical filter 6b or 302 and does not enter the first and second photoelectric conversion elements A and B. In contrast, light in a wavelength range transmitted based on surface plasmon resonance between the structures 11 or 311 in the first optical filter 6a or 301 and the structures 12 or 321 in the second optical filter 6b or 302 is not absorbed by the first and second photoelectric conversion elements A and B.

Thus, light in a wavelength range transmitted through the boundary area between the first optical filter 6a or 301 and the second optical filter 6b or 302 has no effect on the characteristics of the sensor because such light is not absorbed by the first and second photoelectric conversion elements A and B or detected by the first and second photoelectric conversion elements A and B.

Therefore, highly accurate wavelength selectivity can be obtained, while the wavelength of light to be transmitted can be freely selected by using the first and second optical filters 6a or 301 and 6b or 302, namely, the first and second plasmonic filters 6a or 301 and 6b or 302, without being affected by light having a wavelength transmitted at a period between the structures 11 or 311 and 12 or 321 formed in the boundary area between the adjacent plasmonic filters 6a or 301 and 6b or 302.

In other words, when plural types of plasmonic filters 6a or 301 and 6b or 302 are disposed adjacent to each other, the interval between the periodic structures 11 or 311 and the periodic structures 12 or 321 in the boundary area is made equal to or larger than the size with which light having a maximum wavelength that is absorbable by the plural photoelectric conversion elements A and B is not transmitted based on surface plasmon resonance. As a result, a photoelectric conversion device incorporating the plural plasmonic filters 6a or 301 and 6b or 302 having accurate wavelength selectivity can be obtained, while the wavelength of light to be transmitted through the plasmonic filters 6a or 301 and 6b or 302 can be freely selected, without having any effect, on the plural photoelectric conversion elements A and B, of light having a wavelength transmitted at a period formed in the boundary area between the adjacent plasmonic filters 6a or 301 and 6b or 302.

According to the present invention, the first and second optical filters 6a or 301 and 6b or 302 having different periodic structures 11 or 311 and 12 or 321 can be freely arranged without any strict restriction.

The materials of the first and second photoelectric conversion elements A and B may be the same or different and are preferably the same from the viewpoint of their production. The materials of the first and second optical filters 6a or 301 and 6b or 302 may also be the same or different and are preferably the same from the viewpoint of their production.

The photoelectric conversion device of the present invention includes the first and second photoelectric conversion elements A and B and the first and second optical filters 6a or 301 and 6b or 302. It should be understood that, as long as a photoelectric conversion device includes the first and second photoelectric conversion elements A and B and the first and second optical filters 6a or 301 and 6b or 302, the photoelectric conversion device further including a third photoelectric conversion element and a third optical filter is also within the scope of the present invention.

In an embodiment,
the first and second photoelectric conversion elements A and B include at least silicon and a silicon oxide film 3.

Since the first and second photoelectric conversion elements A and B include the silicon oxide film 3 and silicon, which is a material often used for a semiconductor device, according to the embodiment, the first and second photoelectric conversion elements A and B have advantages of ease of handling in an ordinary semiconductor process and applicability to an RGB sensor for light including visible light (380 nm to 750 nm).

In an embodiment,
conductive material films of the first and second optical filters 6a or 301 and 6b or 302 are made of Al or an Al alloy (e.g., AlCu or AlSi).

Since the first and second optical filters 6a or 301 and 6b or 302 are made of Al or an Al alloy in the embodiment, the surface plasmon resonance at a short wavelength of about 400 nm occurs, and the first and second optical filters 6a or 301 and 6b or 302 can be applied to an RGB sensor.

Since the Al or the Al alloy is a material used in an ordinary semiconductor process, it is advantageous in process integration and inexpensive and the production process is simple such that plasmonic filters corresponding to different wavelengths can be formed together.

In an embodiment,
a photoelectric conversion device further includes:
a third photoelectric conversion element; and
a third optical filter that has a third pattern periodically having plural structures and is formed of a conductive material film disposed on the third photoelectric conversion element with an insulating film therebetween.

The first, second, and third optical filters transmit the three primary colors of light or complementary colors of light for the three primary colors.

According to the embodiment, an RGB sensor can be formed.

In an embodiment,
the first and second photoelectric conversion elements A and B and a circuit portion 50 that performs signal processing on outputs from the first and second photoelectric conversion elements A and B are formed on the same substrate 1.

Since the first and second photoelectric conversion elements A and B and the circuit portion 50 are formed on and integrated with the same substrate 1 according to the embodiment, noise reduction and size reduction can be achieved.

In an embodiment,
a shield metal portion 52 is provided in the same layer as that of the first optical filter 6a and the second optical filter 6b, and the shield metal portion 52 covers the circuit portion 50 and a region between the circuit portion 50 and the first photoelectric conversion element A.

Since the shield metal portion 52 is provided in the same layer as that of the first optical filter 6a and the shield metal portion 52 covers the circuit portion 50 and a region between the circuit portion 50 and the first photoelectric conversion element A according to the embodiment, generation of spurious signals can be eliminated or reduced by inhibiting stray light from entering the first photoelectric conversion element A and the circuit portion 50, resulting in reduced malfunction and improved durability.

In an embodiment,
the first and second photoelectric conversion elements A and B include at least silicon and a silicon oxide film 3,
the conductive material films of the first and second optical filters 6a and 6b are made of Al or an Al alloy (e.g., AlCu or AlSi),
the structures 11 and 12 in the first and second patterns are circular openings 11 and 12, and
the interval a between the first pattern and the second pattern is at least 600 nm.

In the embodiment, the first and second photoelectric conversion elements A and B include at least silicon and the silicon oxide film 3, and the interval a between the first pattern and the second pattern is at least 600 nm. The wavelength of light absorbed by silicon is about 300 to 1200 nm.

Therefore, since the interval between the circular opening 11 in the first optical filter 6a and the circular opening 12 in the second optical filter 6b is at least 600 nm according to the embodiment, light in a wavelength range transmitted based on surface plasmon resonance between the circular opening 11 of the first optical filter 6a and the circular opening 12 of the second optical filter 12 has no effect on the characteristics of the sensor. This is because such light is not absorbed by the first and second photoelectric conversion elements including the silicon oxide film and silicon, which absorbs light having wavelengths of about 300 to 1200 nm, or detected by the first and second photoelectric conversion elements A and B.

Therefore, in this embodiment, highly accurate wavelength selectivity can be obtained, while the wavelength of light to be transmitted can be freely selected by using the first and second optical filters 6a and 6b, namely, the first and second plasmonic filters 6a and 6b, without being affected by light having a wavelength transmitted at a period a between the openings 11 and 12 formed in the boundary area between the adjacent plasmonic filters 6a and 6b.

Since the first and second photoelectric conversion elements A and B include at least silicon and the silicon oxide film 3 in the embodiment, the first and second photoelectric conversion elements A and B are easy to handle in an ordinary semiconductor process, can also be applied to an RGB sensor for light including visible light (380 nm to 750 nm). In addition, since the first and second optical filters 6a and 6b are made of Al or an Al alloy (e.g., AlCu or AlSi), they are advantageous in process integration and inexpensive, and the production process is simple such that the optical filters 6a and 6b corresponding to different wavelengths can be formed together.

In an embodiment,
the structures in the first and second patterns are slits 311 and 321.

According to the embodiment, the effect of the wavelength selection based on the plasmonic effect is obtained even with the slit structure by appropriately selecting the periods (pitches) P1 and P2 and the slit widths S1 and S2.

In an embodiment,
the first and second optical filters 6a or 301 and 6b or 302 are grounded.

According to the embodiment, the first and second optical filters 6a or 301 and 6b or 302 are grounded, so that the potential of the first and second optical filters 6a or 301 and 6b or 302, which form the plasmonic filter region, is stable and the behavior of electrons is stable to provide good wavelength selectivity. If the potential of the first and second optical filters 6a or 301 and 6b or 302, which form the plasmonic filter region, varies, the wavelength selectivity is adversely affected.

In an embodiment,
a conductive material film 400 that covers the outermost portions of plural slits 311 and 321 in the first and second patterns is provided.

Since the conductive material film 400 covers the outermost portions of the plural slits 311 and 321 in the first and second patterns according to the embodiment, the conductive material film 400 can cut off light transmitted through both longitudinal end portions 311b, 321b, . . . of each of the slits 311, 321, . . . and the slits 311a and 321a in both ends which tend to have an uneven shape because of the effect of interference light from the adjacent opening during exposure and the microloading effect during etching. Even with the slit structure, plasmonic filters having desired wavelength selectivity can be formed.

It should be understood that the components described in the first to fifth embodiments and modifications may be appropriately combined or may be appropriately selected, substituted, or deleted.

REFERENCE SIGNS LIST

1 P-type silicon semiconductor substrate
2 Electrode
3, 5, 7 Silicon oxide film
6a, 301 First optical filter
6b, 302 Second optical filter
11, 12, 301, 302 Opening
50 Circuit portion
52 Shield metal portion
400 Conductive material film (Third metal film)
A First photoelectric conversion element
B Second photoelectric conversion element

The invention claimed is:

1. A photoelectric conversion device, comprising:
a first photoelectric conversion element;
a second photoelectric conversion element;
a first optical filter that has a first pattern periodically having a plurality of structures and is formed of a conductive material film disposed on the first photoelectric conversion element with an insulating film therebetween; and
a second optical filter that has a second pattern periodically having a plurality of structures and is formed of a conductive material film disposed on the second photoelectric conversion element with the insulating film therebetween,
wherein an interval between the first pattern and the second pattern that are adjacent to each other is configured to permit transmission of light having wavelengths longer than a maximum wavelength of light that can be photoelectrically converted by the first photoelectric conversion element and the second photoelectric conversion element and is configured to prevent transmission of light having wavelengths shorter than or equal to the maximum wavelength of light that can be photoelectrically converted by the first photoelectric conversion element and the second photoelectric conversion element.

2. The photoelectric conversion device according to claim 1, wherein
the first and second photoelectric conversion elements include at least silicon and a silicon oxide film.

3. The photoelectric conversion device according to claim 1, wherein
the conductive material films of the first and second optical filters are made of Al or an Al alloy.

4. The photoelectric conversion device according to claim 1, wherein
the first and second photoelectric conversion elements and a circuit portion that performs signal processing on outputs from the first and second photoelectric conversion elements are formed on an identical substrate, and
a shield metal portion is provided in a layer including the first optical filter and the second optical filter, and the shield metal portion covers the circuit portion and a region between the circuit portion and the first photoelectric conversion element.

5. The photoelectric conversion device according to claim 1, wherein
the first and second photoelectric conversion elements include at least silicon and a silicon oxide film,
the conductive material films of the first and second optical filters are made of Al or an Al alloy,
the structures in the first and second patterns are circular openings, and
the interval between the first pattern and the second pattern is at least 600 nm.

6. The photoelectric conversion device according to claim 1, wherein
the structures in the first and second patterns are slits.

7. The photoelectric conversion device according to claim 1, wherein
the first and second optical filters are grounded.

8. A photoelectric conversion device comprising:
a first photoelectric conversion element;
a second photoelectric conversion element;
a first optical filter that has a first pattern periodically having a plurality of structures and is formed of a conductive material film disposed on the first photoelectric conversion element with an insulating film therebetween; and
a second optical filter that has a second pattern periodically having a plurality of structures and is formed of a conductive material film disposed on the second photoelectric conversion element with the insulating film therebetween,
wherein an interval between the first pattern and the second pattern that are adjacent to each other is longer than a period of the structures in the first pattern and a period of the structures in the second pattern, the structures in the first and second patterns are slits, and
the photoelectric conversion device includes a conductive material film that covers outermost portions of the plurality of slits in the first and second patterns.

* * * * *